(12) United States Patent  (10) Patent No.: US 6,636,087 B2
Miyazaki                    (45) Date of Patent:     Oct. 21, 2003

(54) SPIKE CURRENT REDUCING CIRCUIT

(75) Inventor: Katsumi Miyazaki, Tokyo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 10/160,238

(22) Filed: Jun. 4, 2002

(65) Prior Publication Data
US 2003/0006810 A1 Jan. 9, 2003

(30) Foreign Application Priority Data
Jul. 6, 2001  (JP) ........................................ 2001-206803

(51) Int. Cl.[7] ................................................. H03B 1/00
(52) U.S. Cl. ........................ 327/108; 327/130; 327/313
(58) Field of Search ................................ 327/108, 112, 327/130, 310, 313, 427; 326/26, 27, 83; 307/412; 361/111

(56) References Cited

U.S. PATENT DOCUMENTS 6,265,915 B1 * 7/2001 Rider et al. ................. 327/112
6,366,114 B1 * 4/2002 Liu et al. ..................... 326/27

FOREIGN PATENT DOCUMENTS

JP  0846502     2/1996
JP  2000269747  9/2000

* cited by examiner

Primary Examiner—Terry D. Cunningham
Assistant Examiner—Long Nguyen
(74) Attorney, Agent, or Firm—Burns, Doane, Swecker & Mathis, LLP

(57) ABSTRACT

Charge accumulated at an output node of an output transistor is discharged to the ground through the output transistor as a spike current. To reduce noise of the spike current, a control signal is sent from an output transistor driving circuit set to a low impedance to the output transistor in a first driving stage to quickly turn on the output transistor, a control signal is sent from the output transistor driving circuit set to a high impedance to the output transistor in a second driving stage to output the spike current through the output transistor at a fixed rate, and a control signal is sent from the output transistor driving circuit set to a low impedance to the output transistor in a third driving stage to quickly discharge all the charge. Therefore, a time-current characteristic of the spike current is set almost in a trapezoid shape, and both a spike current peak value and a spike current occurrence time period in the spike current can be sufficiently lowered.

7 Claims, 4 Drawing Sheets

SPIKE CURRENT REDUCING CIRCUIT

BACKGROUND OF THE INVENTION

1. Field of the Invention

The present invention relates to a spike current reducing circuit which is generally formed of a semiconductor integrated circuit and is attached to an electric power amplifier, in which a coil is driven according to a switching method based on the pulse width modulation, to reduce a spike current occurring in a switching operation of the coil.

2. Description of Related Art

In a switching operation for driving a coil by using transistors, it is required to turn on and off an output transistor, though which an output current is sent to a load circuit, as fast as possible for the purpose of driving the coil at high efficiency and low ripple percentage.

However, various capacitive components exist in an output node of the output transistor connected to the load circuit. Therefore, when the output transistor is turned on, a large instantaneous current flows from a power source of the output transistor to the ground through the output transistor due to the capacitive components and a load inductance of the load circuit. This large instantaneous current is called a spike current.

Though this spike current flows in a short time, an amount of the spike current is large. Therefore, a spike noise of the power source occurs in a current line from the power source to the ground due to the spike current.

FIG. 6 is a characteristic view showing a time-current characteristic of a spike current occurring in a conventional spike current reducing circuit.

As shown in FIG. 6, a spike current causing a spike noise of the power source is estimated by using the time-current characteristic of the spike current. A first time period from the occurrence of a spike current to a peak time, at which the spike current reaches a peak value, depends on input/output characteristics of the output transistor. A second time period from the peak time to the end of the spike current depends on a capacitance-resistance (CR) discharge characteristic of the output transistor linearly changing with time. The time-current characteristic can be approximately expressed by a straight line in both the first and second time periods. Therefore, the time-current characteristic can be theoretically expressed by a triangle. In this triangle, a length of the base expresses a spike current occurrence time period $\Delta T$ (the sum of the first and second time periods), and a height of the vertex expresses a spike current peak value Ip.

Here, a capacitive component of the CR discharge characteristic linearly changing with time is determined by a capacitance C of the output node of the output transistor, and the capacitance C is obtained as a sum of a load capacitance of the load circuit, an output capacitance of the output transistor and a backward recovery capacitance of a regenerative diode applied for the pulse width modulation control. The capacitance C is a fixed value. Therefore, an amount of a charge accumulated at the output node is also a fixed value.

To reduce the spike noise of the power source, it is required to lower the spike current peak value Ip. To lower the spike current peak value Ip, because of a relation $I \propto Q/T$ (I: the spike current, Q: an amount of the charge of the output node, T: a charge pull-out time period), it is required to lengthen the time period required for pulling out the charge accumulated at the output node. For example, in a spike current peak value method of the conventional spike current reducing circuit, an output impedance of a driving circuit, from which a control signal is input to a control terminal (or a gate) of the output transistor, is heightened to lengthen a rise time period (or a turn-on time period) of the output transistor, and the charge accumulated at the output node is gradually pulled out when an on-resistance (a resistance in a turn-on state) of the output transistor is not sufficiently low. Therefore, the spike current peak value Ip is lowered.

In FIG. 6, an area of the triangle theoretically indicating the time-current characteristic of the spike current corresponds to an amount of the charge ($Q = Ip \times \Delta T/2$) accumulated at the output node. In the above-described method, the theoretical spike current peak value Ip is, for example, lowered by half, to lower the theoretical spike current peak value Ip to a value Ip1, and the theoretical spike current occurrence time period $\Delta T$ is lengthened to a time period $\Delta T1$. In this case, because the amount of the charge accumulated at the output node is constant, the spike current occurrence time period $\Delta T1$ is twice as long as the theoretical spike current occurrence time period $\Delta T$.

As is described above, in the conventional spike current reducing circuit, in cases where the spike current peak value Ip is lowered by a prescribed rate to lower the spike noise of the power source, the spike current occurrence time period $\Delta T$ is lengthened by a rate inverse to the prescribed rate of the spike current peak value to maintain the charge amount $Q = Ip \times \Delta T/2$.

In cases where the conventional spike current reducing circuit is applied for the pulse width modulation control, it is desired to heighten a carrier frequency for the pulse width modulation for the purpose of lowering the ripple percentage. However, because the spike current occurrence time period is lengthened in the conventional spike current reducing circuit, the heightening of the carrier frequency is suppressed. Also, because a masking operation and a filtering operation are performed during the spike current occurrence time period in a current chopper type pulse width modulation (PWM) control system, the precision in the detection of a very low current is degraded in the PWM control system in cases where the spike current occurrence time period is lengthened in the conventional spike current reducing circuit. Therefore, a problem has arisen that it is difficult in the conventional spike current reducing circuit to sufficiently lower both the spike current peak value and the spike current occurrence time period.

SUMMARY OF THE INVENTION

An object of the present invention is to provide, with due consideration to the drawbacks of the conventional spike current reducing circuit, a spike current reducing circuit in which both a spike current peak value and a spike current occurrence time period in a spike current are sufficiently lowered.

The object is achieved by the provision of a spike current reducing circuit comprising an output transistor having a control terminal for outputting a spike current according to a control signal received at the control terminal, and an output transistor driving circuit for sending the control signal to the control terminal of the output transistor through a signal line of a first low impedance in a first driving stage to drive the output transistor at a high speed, sending the control signal to the control terminal of the output transistor through a signal line of a high impedance in a second driving stage to drive the output transistor at a low speed, and sending the control signal to the control terminal of the output transistor through a signal line of a second low impedance in a third driving stage to drive the output transistor at a high speed.

In the above configuration, the impedance of the output transistor driving circuit for the control signal is changed stage by stage. Accordingly, both a spike current peak value and a spike current occurrence time period in the spike current can be sufficiently lowered in the spike current reducing circuit. Also, in cases where the spike current reducing circuit is applied for the pulse width modulation control, the pulse width modulation control can be quickly performed, and an adverse influence of the noise of the spike current can be reduced.

It is preferred that the output transistor driving circuit comprises a pull-up resistor, and a mirror transistor, which is connected with the output transistor in a mirror connection and is connected to the pull-up resistor through a signal line, for maintaining a voltage level of the signal line during the first driving stage and outputting a prescribed amount of sink current to change the voltage level of the signal line and to perform a transfer from the first driving stage to the second driving stage in response to the change of the voltage level of the signal line.

Therefore, a degree of the turn-on of the output transistor is rapidly detected by the output transistor driving circuit, and the change from the first driving stage to the second driving stage can be automatically performed at the optimum timing.

It is preferred that the change from the second driving stage to the third driving stage is performed in response to the change of an output voltage of the output transistor to a prescribed level.

Therefore, the change from the second driving stage to the third driving stage can be automatically performed at the optimum timing according to a remaining charge to be discharged through the output transistor.

It is preferred that the output transistor driving circuit comprises an inverter, having a threshold voltage adjusted according to the prescribed voltage level, for producing a trigger signal according to both the output voltage of the output transistor and the threshold voltage and changing the signal line of the high impedance in the second driving stage to the signal line of the second low impedance in the third driving stage according to the trigger signal.

Therefore, because the remaining charge is proportional to the output voltage of the output transistor, the change from the second driving stage to the third driving stage can be automatically performed at the optimum timing by adjusting the threshold voltage of the inverter.

It is preferred that a time-current characteristic of the spike current output from the output transistor is set almost in a trapezoid shape.

Therefore, both the spike current peak value and the spike current occurrence time period in the spike current can be sufficiently lowered.

It is preferred that the output transistor driving circuit comprises a first low impedance driving circuit through which the control signal is sent to the control terminal of the output transistor at the first low impedance in the first driving stage, a high impedance driving circuit through which the control signal is sent to the control terminal of the output transistor at the high impedance in the second driving stage, a second low impedance driving circuit through which the control signal is sent to the control terminal of the output transistor at the second low impedance in the third driving stage, and a changing circuit for changing the control signal flowing through the first low impedance driving circuit to the control signal flowing through the high impedance driving circuit by changing a voltage level applied to the first low impedance driving circuit in response to the outputting of a prescribed amount of sink current, and changing the control signal flowing through the high impedance driving circuit to the control signal flowing through the second low impedance driving circuit by changing an output voltage of the output transistor to a prescribed level.

Therefore, the change from the first driving stage to the second driving stage can be automatically performed by the changing circuit at the optimum timing, and the change from the second driving stage to the third driving stage can be automatically performed by the changing circuit at the optimum timing.

It is preferred that the second low impedance driving circuit comprises a plurality of second high impedance driving circuits arranged in parallel to each other, and the changing circuit comprises a plurality of inverters, which have a plurality of threshold voltage values different from each other and are connected to the second high impedance driving circuits respectively, for respectively making the control signal flow through the corresponding second high impedance driving circuit in cases where the output voltage of the output transistor is lowered to a value lower than the corresponding threshold value.

In the above configuration, the number of second high impedance driving circuits, through which the control signal is sent to the control terminal of the output transistor, is gradually increased in the third driving stage. Therefore, the change from the second driving stage to the third driving stage can be performed while smoothly changing the spike current value, and a time-current characteristic of the spike current can be set almost in an ideal trapezoid shape.

DETAILED DESCRIPTION OF THE PREFERRED EMBODIMENTS

Embodiments of the present invention will now be described with reference to the accompanying drawings.
Embodiment 1

Figure 1:
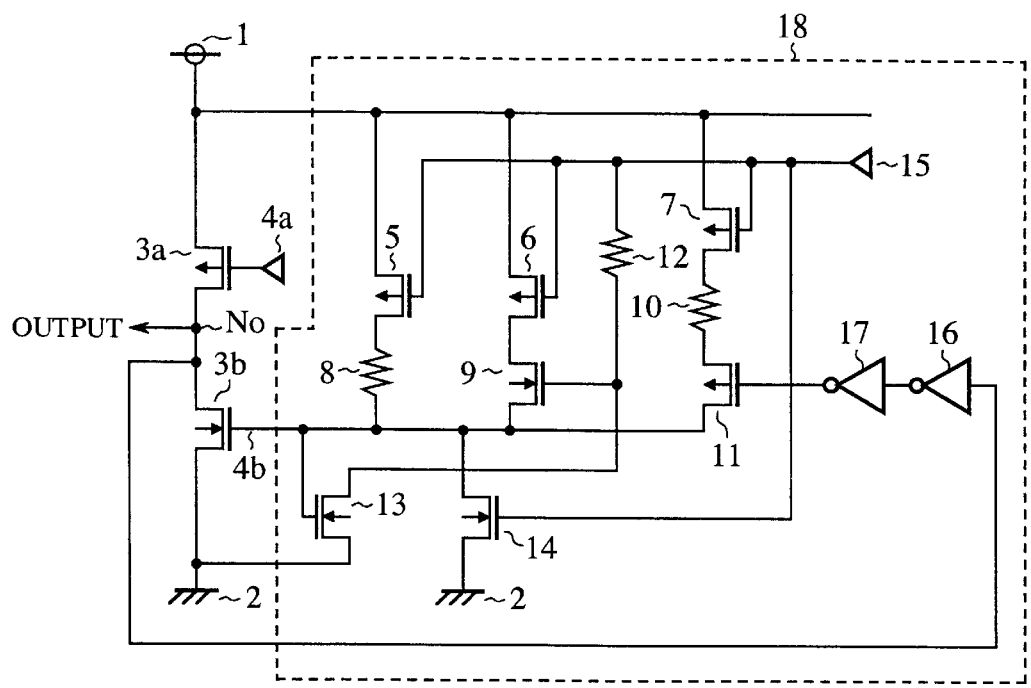
FIG. 1 is a circuit view showing a spike current reducing circuit according to a first embodiment of the present invention.

FIG. 1 is a circuit view showing a spike current reducing circuit according to a first embodiment of the present invention. In FIG. 1, 1 indicates a power source, and 2 indicates the ground. 3a indicates an output transistor placed on a source side. 3b indicates an output transistor placed on a sink side. The output transistors 3a and 3b are serially placed between the power source 1 and the ground 2, and an electric power is supplied as an output from the power source 1 to a load circuit (not shown) through the output transistor 3a and an output node No placed between the output transistors 3a and 3b. 4a indicates a control terminal of the output transistor 3a. A voltage signal of a low (L) level or a high (H) level is applied to the gate of the output transistor 3a through the control terminal 4a. 4b indicates a control terminal 4b of the output transistor 3b. A control signal of an L level or an H level is applied to the gate of the output transistor 3b through the control terminal 4b.

18 indicates an output transistor driving circuit for driving the output transistor 3b by applying a control signal of an L level or an H level to the control terminal 4b of the output transistor 3b to drive the output transistor 3b. In the output transistor driving circuit 18, an impedance of a signal line (or signal lines) between the power source 1 and the control terminal 4b of the output transistor 3b is changed in both the transition from a first driving stage to a second driving stage and the transition from the second driving stage to a third driving stage. In detail, the impedance of the output transistor driving circuit 18 is set to a low value in the first driving stage to drive the output transistor 3b at a high speed, the impedance of the output transistor driving circuit 18 is set to a high value in the second driving stage to drive the output transistor 3b at a low speed, and the impedance is set to a low value in the third driving stage to drive the output transistor 3b at a high speed.

5 indicates a transistor through which a control signal of the H level is supplied from the power source 1 to the control terminal 4b of the output transistor 3b in the first, second and third driving stages. 6 indicates a transistor through which a control signal of the H level is supplied from the power source 1 to the control terminal 4b of the output transistor 3b in the first driving stage. 7 indicates a transistor through which a control signal of the H level is supplied from the power source 1 to the control terminal 4b of the output transistor 3b in the third driving stage.

8 indicates a resistor for adjusting the impedance of the output transistor driving circuit 18 in the first, second and third driving stages. 9 indicates a transistor for changing the low impedance of the first driving stage to the high impedance of the second driving stage. 10 indicates a resistor for adjusting the impedance of the output transistor driving circuit 18 in the third driving stage. 11 indicates a transistor for changing the high impedance of the second driving stage to the low impedance of the third driving stage. 12 indicates a resistor (or a pull-up resistor) for maintaining a voltage of a control terminal of the transistor 9 in the first driving stage and lowering the voltage to change the first driving stage to the second driving stage. The resistor 12 is pulled up in advance by the power source 1. 13 indicates a transistor (or a mirror transistor) connected with the output transistor 3b in a current mirror connection. 14 indicates a transistor for turning off the output transistor 3b in an operation other than the operations of the first, second and third driving stages. 15 indicates an input terminal through which a voltage signal of an L level or an H level is sent to the control terminals of the transistors 5, 6, 7 and 14. 16 indicates an inverter for inverting a signal indicating an output voltage of the output transistor 3b in cases where a level of the signal is equal to or higher than a threshold voltage value. The threshold voltage value is preset in the inverter 16. 17 indicates an inverter for inverting an output of the inverter 16 and applying the inverted output to the control terminal of the transistor 11 to control the transistor 11.

Here, a first low impedance driving circuit is composed of the transistors 5, 6 and 9 and the resistor 8, and a voltage signal of the H level is applied from the power source 1 to the control terminal 4b of the output transistor 3b through the first low impedance driving circuit in the first stage. A high impedance driving circuit is composed of the transistor 5 and the resistor 8, and a voltage signal of the H level is applied from the power source 1 to the control terminal 4b of the output transistor 3b through the high impedance driving circuit in the second stage. A second low impedance driving circuit is composed of the transistors 5, 7 and 11 and the resistors 8 and 10, and a voltage of the H level is applied from the power source 1 to the control terminal 4b of the output transistor 3b through the second low impedance driving circuit in the third stage. Also, a stage changing circuit (or a changing circuit) is composed of the resistor 12, the transistor 13 and the inverters 16 and 17.

Also, the output transistor 3a and the transistors 5, 6, 7 and 11 are formed of p-channel metal-oxide-semiconductor field effect transistors (MOSFETs) respectively. The output transistor 3b and the transistors 9, 13 and 14 are formed of n-channel MOSFETs.

Figure 2:
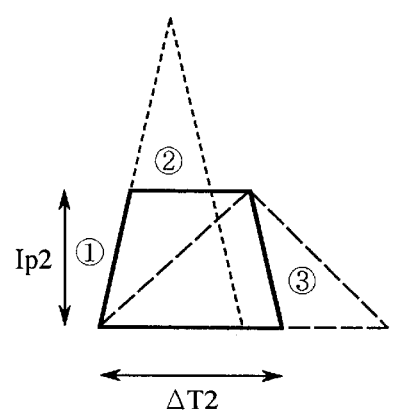
FIG. 2 is a characteristic view showing a time-current characteristic of a spike current occurring in the spike current reducing circuit shown in FIG. 1.

FIG. 2 is a characteristic view showing a time-current characteristic of the spike current occurring in the spike current reducing circuit according to the first embodiment of the present invention.

Next, an operation of the spike current reducing circuit will be described below.

Figure 6:
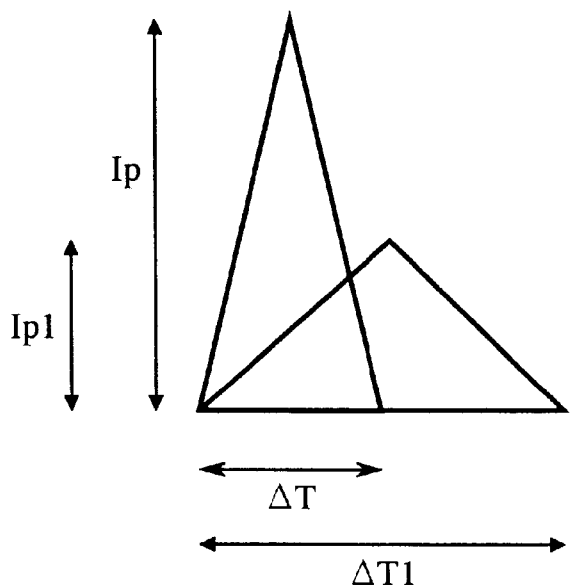
FIG. 6 is a characteristic view showing a time-current characteristic of a spike current occurring in a conventional spike current reducing circuit.

In the prior art, when it is desired to turn on the output transistor 3b, a voltage signal is sent to the control terminal 4b of the output transistor 3b through a conventional transistor driving circuit set to a fixed impedance. However, in the first embodiment, a voltage signal is sent to the control terminal 4b of the output transistor 3b through the output transistor driving circuit 18 of which the impedance is changed stage by stage. In detail, the time-current characteristic of the spike current is not set to a triangular shape shown in FIG. 6, but the output transistor 3b is turned on according to the time-current characteristic of the spike current set almost in a trapezoid shape shown in FIG. 2.

To obtain the time-current characteristic of the spike current almost set to a trapezoid shape, a driving operation of the output transistor 3b is partitioned into a high speed driving operation of the first driving stage, a low speed driving operation of the second driving stage and a high speed driving operation of the third driving stage, and the first, second and third driving stages of the driving operation are successively performed in that order.

(1) The high speed driving operation of the first driving stage (formation of a left inclined side $\hat{1}$ of the trapezoid shown in FIG. 2)

A voltage signal of the power source 1 is sent to the control terminal 4b of the output transistor 3b through the output transistor driving circuit 18 set to a low impedance to shorten a time required to reach a spike current peak value Ip2.

(2) The low speed driving operation of the second driving stage (formation of an upper side $\hat{2}$ of the trapezoid shown in FIG. 2)

After the spike current reaches the spike current peak value Ip2, the voltage signal is sent to the control terminal 4b of the output transistor 3b through the output transistor driving circuit 18 set to a high impedance to keep the spike current peak value Ip2 of the spike current.

(3) The high speed driving operation of the third driving stage (formation of a right inclined side $\hat{3}$ of the trapezoid shown in FIG. 2)

When most of the charge accumulated at the output node No of the output transistors 3a and 3b is discharged, the spike current does not exceed the spike current peak value Ip2 even though the voltage signal is sent to the control terminal 4b of the output transistor 3b through the output transistor driving circuit 18 set to a low impedance. Therefore, the voltage signal is sent to the control terminal 4b of the output transistor 3b through the output transistor driving circuit 18 set to a low impedance to heighten the discharging of the spike current.

The three driving stages will be described in detail.

When an output signal OUT of an H level is supplied to the load circuit while turning off the output transistor 3b, a voltage signal set to an H level is applied to the input terminal 15. Therefore, the output transistor 3a is set in a turn-on state, and the transistor 11 is set in a turn-off state due to the output current OUT. Also, the transistors 5, 6 and 7 are set in a turn-off state, and the transistors 9 and 14 are respectively set in a turn-on state.

When it is desired to supply an output signal OUT of an L level to the load circuit, the output transistor 3a is turned off, and a voltage signal set to an L level is applied to the input terminal 15 to start the high speed driving operation of the first driving stage. Therefore, the transistors 5, 6 and 7 are immediately turned on, and the transistor 14 is immediately turned off. However, the transistor 9 is still set in the turn-on state due to the resistor 12, and the transistor 11 is still set in the turn-off state because the H level of the output voltage of the output transistor 3b is still maintained. Therefore, the first low impedance driving circuit having the transistors 5, 6 and 9 and the resistor 8 is formed between the power source 1 and the control terminal 4b of the output transistor 3b. The first low impedance driving circuit is composed of both a first signal line of the transistor 5 and the resistor 8 and a second signal line of the transistors 6 and 9, and the first and second signal lines are connected to the control terminal 4b of the output transistor 3b in parallel to each other. Because a voltage signal is sent from the voltage source 1 to the control terminal 4b of the output transistor 3b through the first and second signal lines placed in parallel to each other, the output transistor driving circuit 18 is set to a low impedance, and the output transistor 3b is driven at a high speed in the start of a driving operation of the output transistor 3b. In other words, the charge accumulated at the output node No of the output transistors 3a and 3b is quickly discharged to the ground 2 through the output transistor 3b. This operation corresponds to the left inclined side 1 of the trapezoid shown in FIG. 2.

Also, the transistor 13 is driven at a high speed in the same manner as the output transistor 3b, and a pull-up charge is pull out from a line between the resistor 12 and the transistor 13 to the ground 2 through the transistor 13 as a sink current.

Therefore, after a while, an amount of the charge discharged by the sink current reaches a prescribed value, the H level at the control terminal of the transistor 9 is lowered to the L level, and the transistor 9 is turned off. At this time, the second signal line of both the transistors 6 and 9 is electrically disconnected from the control terminal 4b of the output transistor 3b, and the high impedance driving circuit having the transistor 5 and the resistor 8 is formed between the power source 1 and the control terminal 4b of the output transistor 3b. The high impedance driving circuit is composed of only the first signal line of both the transistor 5 and the resistor 8. Because the voltage signal is sent from the voltage source 1 to the control terminal 4b of the output transistor 3b through only the first signal line, the output transistor driving circuit 18 is set to a high impedance. In this case, the output transistor 3b is driven at a low speed in the middle of the driving operation of the output transistor 3b. In other words, the charge accumulated at the output node No of the output transistors 3a and 3b is discharged to the ground 2 through the output transistor 3b at a constant discharging rate. This operation corresponds to the upper side 2 of the trapezoid shown in FIG. 2.

Therefore, because the lowering of the level at the control terminal of the transistor 9 due to the sink current of the transistor 13 is used as a trigger of the turn-off of the transistor 9, information of a degree of the turn-on of the output transistor 3b can be quickly sent to the transistor 9, and the high speed driving operation of the first driving stage can be reliably changed to the low speed driving operation of the second driving stage at an optimum timing. Here, the timing of the transition from the high speed driving operation to the low speed driving operation is appropriately set by adjusting both a current ratio of the transistor 13 to the output transistor 3b and a resistance value of the resistor 12.

Thereafter, the output transistor 3b is turned on in some degree. Therefore, the charge accumulated at the output node No of the output transistors 3a and 3b is lowered so as to lower the output voltage of the output transistor 3b at the output node No. When the charge accumulated at the output node No is lowered to a prescribed value, the output voltage of the output transistor 3b at the output node No becomes lower than the threshold voltage value preset in the inverter 16, and the voltage signal input to the inverter 16 is not inverted. Therefore, the transistor 11 is turned on, and a third signal line of both the transistors 7 and 11 and the resistor 10 is electrically connected with the control terminal 4b of the output transistor 3b. In this case, the second low impedance driving circuit having the transistors 5, 7 and 11 and the resistors 8 and 10 is formed between the power source 1 and the control terminal 4b of the output transistor 3b. The second low impedance driving circuit is composed of both the first signal line of the transistor 5 and the resistor 8 and the third signal line of the transistors 7 and 11 and the resistor 10, and the first and third signal lines are connected to the control terminal 4b of the output transistor 3b in parallel to each other. Because the voltage signal is sent from the voltage source 1 to the control terminal 4b of the output transistor 3b through the first and third signal lines placed in parallel to each other, the output transistor driving circuit 18 is set to a low impedance, and the output transistor 3b is driven at a high speed in the end of the driving operation. In other words, the charge remaining at the output node No is quickly discharged to the ground 2 through the output transistor 3b. This operation corresponds to the right inclined side 3 of the trapezoid shown in FIG. 2.

Therefore, because the lowering of the output voltage of the output transistor 3b at the output node No is used as a trigger of the turn-on of the transistor 11, information of the charge remaining at the output node No can be quickly sent to the transistor 11, and the low speed driving operation of the second driving stage can be reliably changed to the high speed driving operation of the third driving stage at an optimum timing. Here, because the threshold voltage value of the inverter 16 is proportional to the charge remaining at the output node No, the timing of the transition from the low speed driving operation of the second stage to the high speed driving operation of the third stage is appropriately set by adjusting the threshold voltage value of the inverter 16.

Assuming that a delay circuit is used to set the timing of the transition from the high speed driving operation of the first driving stage to the low speed driving operation of the second driving stage or the timing of the transition from the low speed driving operation of the second driving stage to the high speed driving operation of the third driving stage, in cases where a load operation point or a source voltage of the voltage source 1 is changed with time, the preset timing becomes inappropriate, and the discharge of the charge is delayed. However, in the first embodiment, because the inverter 16 is used, the transition from the low speed driving operation of the second driving stage to the high speed driving operation of the third driving stage can be quickly performed at the optimum timing.

As is described above, in the first embodiment, because the impedance of the output transistor driving circuit 18 is lowered in the fist driving stage, is heightened in the second driving stage and is again lowered in the third driving stage, the output transistor 3b is driven and turned on so as to set the time-current characteristic of the spike current almost in a trapezoid shape. Accordingly, both the spike current peak value Ip2 and the spike current occurrence time period ΔT2 in the spike current can be sufficiently lowered in the spike current reducing circuit. Therefore, in cases where the spike current reducing circuit is applied for the pulse width modulation control, the pulse width modulation control can be quickly performed, and an adverse influence of the spike noise of the voltage source 1 can be reduced.

Embodiment 2

Figure 3:
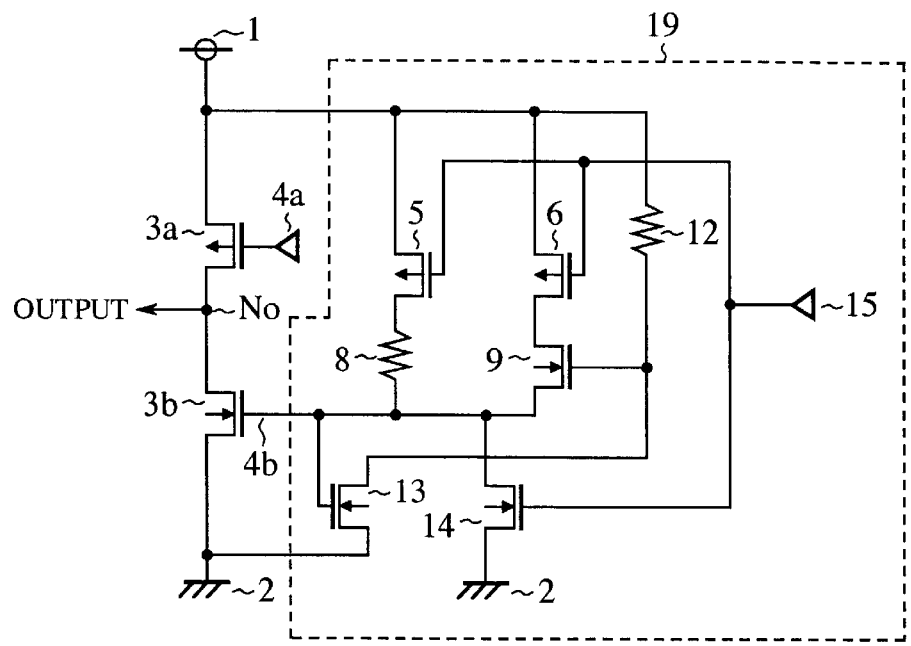
FIG. 3 is a circuit view showing a spike current reducing circuit according to a second embodiment of the present invention.

FIG. 3 is a circuit view showing a spike current reducing circuit according to a second embodiment of the present invention.

In FIG. 3, 19 indicates an output transistor driving circuit for supplying a voltage signal to the control terminal 4b of the output transistor 3b to drive the output transistor 3b according to both the high speed driving operation of the first driving stage and the low speed driving operation of the second driving stage. The output transistor driving circuit 19 differs from that of the first embodiment in that either the third signal line of the transistors 7 and 11 and the resistor 10 or the combination of the inverters 16 and 17 is not arranged. Therefore, both the high speed driving operation of the first driving stage and the low speed driving operation of the second driving stage are performed in the spike current reducing circuit, but no high speed driving operation of the third driving stage is performed in the spike current reducing circuit.

Accordingly, in the second embodiment, because both the high speed driving operation of the first driving stage and the low speed driving operation of the second driving stage are performed in the spike current reducing circuit, both the spike current peak value Ip2 and the spike current occurrence time period ΔT2 in the spike current can be lowered in the spike current reducing circuit.

Embodiment 3

Figure 4:
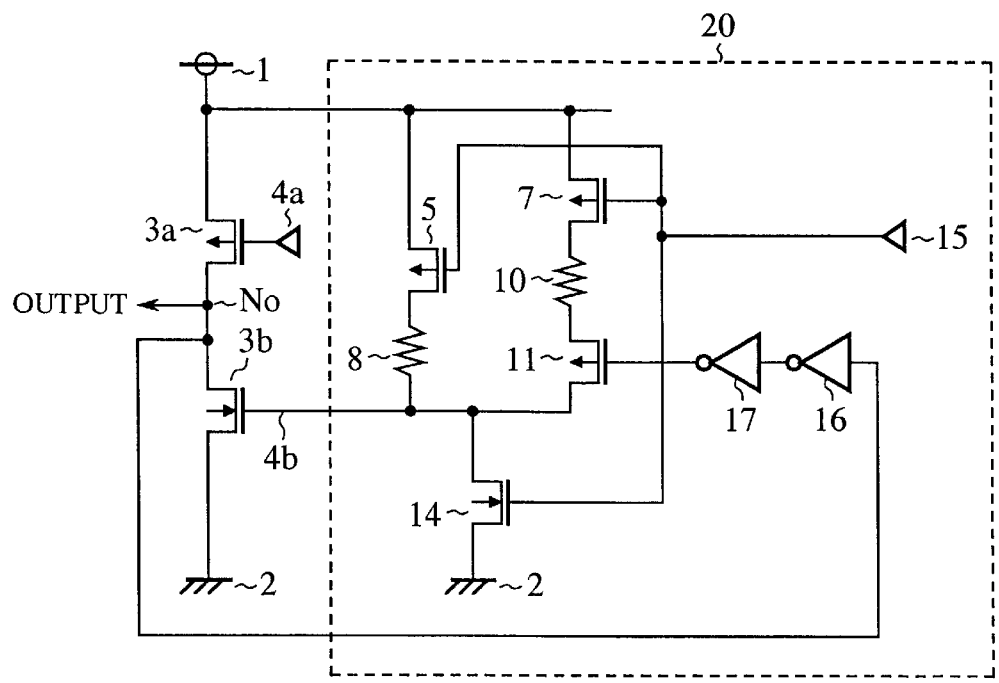
FIG. 4 is a circuit view showing a spike current reducing circuit according to a third embodiment of the present invention.

FIG. 4 is a circuit view showing a spike current reducing circuit according to a third embodiment of the present invention.

In FIG. 4, 20 indicates an output transistor driving circuit for supplying a voltage signal to the control terminal 4b of the output transistor 3b to drive the output transistor 3b according to both the low speed driving operation of the second driving stage and the high speed driving operation of the third driving stage. The output transistor driving circuit 20 differs from that of the first embodiment in that either the second signal line of the transistors 6 and 9 or the combination of the resistor 12 and the transistor 13 is not arranged. Therefore, both the low speed driving operation of the second driving stage and the high speed driving operation of the third driving stage are performed in the spike current reducing circuit, but no high speed driving operation of the first driving stage is performed in the spike current reducing circuit.

Accordingly, in the third embodiment, because both the low speed driving operation of the second driving stage and the high speed driving operation of the third driving stage are performed in the spike current reducing circuit, both the spike current peak value Ip2 and the spike current occurrence time period ΔT2 in the spike current can be lowered in the spike current reducing circuit.

Embodiment 4

Figure 5:
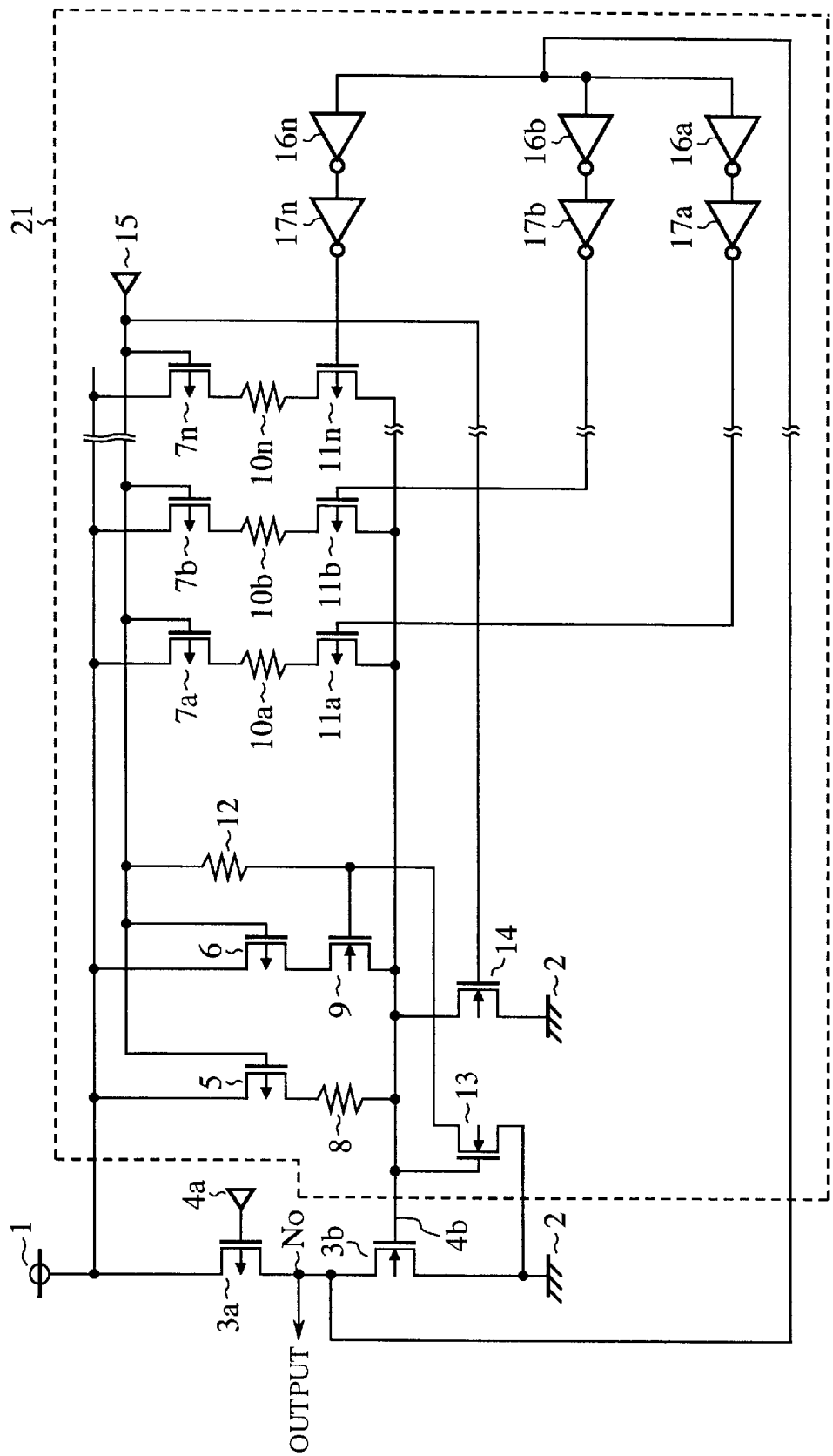
FIG. 5 is a circuit view showing a spike current reducing circuit according to a fourth embodiment of the present invention.

FIG. 5 is a circuit view showing a spike current reducing circuit according to a fourth embodiment of the present invention. The constituent elements, which are the same as those shown in FIG. 1, are indicated by the same reference numerals as those of the constituent elements shown in FIG. 1, and additional description of those constituent elements is omitted.

In FIG. 5, 21 indicates an output transistor driving circuit for supplying a voltage signal to the control terminal 4b of the output transistor 3b to drive the output transistor 3b in the first driving stage, the second driving stage and the third driving stage smoothly transferred from the second driving stage. In the output transistor driving circuit 21, 7a to 7n indicate a plurality of transistors arranged in parallel to each other. 10a to 10n indicate a plurality of resistors connected to the transistors 7a to 7n respectively. 11a to 11n indicate a plurality of transistors connected to the resistors 10a to 10n respectively. A plurality of third signal lines, which respectively have one of the transistors 7a to 7n, one of the resistors 10a to 10n and one of the transistors 11a to 11n, are placed between the voltage source 1 and the control terminal 4b of the output transistor 3b in parallel to each other.

16a to 16n indicate a plurality of inverters for respectively inverting a signal indicating the output voltage of the output transistor 3b at the output node No in cases where a level of the signal is equal to or higher than a threshold voltage value. The threshold voltage values different from each other are preset in the inverters 16a to 16n so as to be lowered in the order of the inverters 16a to 16n. That is, the threshold voltage value of the inverter 16a is highest, and the threshold voltage value of the inverter 16n is lowest. 17a to 17b indicate a plurality of inverters for respectively inverting an output of the corresponding inverter 16a to 16n and applying the inverted output to the control terminal of the corresponding transistor 11a to 11n to control the transistor 11a to 11n.

Therefore, the output transistor driving circuit 21 differs from that of the first embodiment in that a plurality of high impedance driving circuits respectively corresponding to the high impedance driving circuit of the transistors 7 and 11, the resistor 10 and the inverters 16 and 17 are arranged in parallel to each other so as to form a low impedance driving circuit composed of the plurality of high impedance driving circuits.

A stage changing circuit (or a changing circuit) is composed of the inverters 16a to 16n and the inverters 17a to 17n.

Next, an operation of the spike current reducing circuit will be described below.

The high speed driving operation of the first driving stage is performed in the same manner as in the first embodiment, and the output voltage at the output node No is gradually lowered in the low speed driving operation of the second driving stage in the same manner as in the first embodiment. Thereafter, because the threshold voltage values different from each other are preset in the inverters 16a to 16n, the output voltage of the output node No becomes lower than the threshold voltage value preset in the inverter 16a. In this case, a signal of the output voltage input to the inverter 16a is not inverted, and the transistor 11a is turned on. Therefore, the transfer from the low speed driving operation of the second driving stage to the high speed driving operation of the third driving stage is started, and a control signal is sent from the power source 1 to the control terminal 4b of the output transistor 3b through a third signal line of the transistors 7a and 11a and the resistor 10a.

Thereafter, the lowering of the output voltage at the output node No is continued, the inversion operations of the inverters 16b to 16n are stopped one after another, and the transistors 11b to 11n are turned on one after another. In this case, in addition to the third signal line of the transistors 7a and 11a and the resistor 10a, the other third signal lines respectively having one of the transistors 7b to 7n, one of the transistors 11b to 11n and one of the resistors 10b to 10n are electrically connected with the control terminal 4b of the output transistor 3b one after another. Therefore, the impedance of the output transistor driving circuit 21 between the voltage source 1 and the control terminal 4b of the output transistor 3b is gradually decreased during the high speed driving operation of the third driving stage, and the output transistor 3b is smoothly driven at a high speed in the end of the driving operation.

As is described above, in the fourth embodiment, because the lowering of the output voltage of the output transistor 3b at the output node No is used as a trigger of the turn-on operations of the transistors 11a to 11n performed one after another, the low speed driving operation of the second driving stage can be transferred to the high speed driving operation of the third driving stage while smoothly changing a waveform of the spike current, and the output transistor 3b is turned on so as to set the time-current characteristic of the spike current almost in an ideal trapezoid shape. Accordingly, both the spike current peak value Ip2 and the spike current occurrence time period ΔT2 in the spike current can be further sufficiently lowered in the spike current reducing circuit.

In the fourth embodiment, the plurality of high impedance driving circuits having the transistors 7a to 7n, the resistors 10a to 10n, the transistors 11a to 11n, the inverters 16a to 16n and the inverters 17a to 17n are arranged in parallel to each other in place of the high impedance driving circuit of the transistors 7 and 11, the resistor 10 and the inverters 16 and 17 arranged according to the first embodiment. However, it is applicable that the plurality of high impedance driving circuits be arranged in parallel to each other in place of the high impedance driving circuit of the transistors 7 and 11, the resistor 10 and the inverters 16 and 17 arranged according to the third embodiment.

Also, in the first to fourth embodiments, each transistor is formed of the MOSFET. However, it is applicable that each transistor be formed of a complementary MOS transistor or a bipolar transistor.

Also, it is applicable that the output transistor 3a and the transistors 5, 6, 7 and 11 (or 11a to 11n) be formed of n-channel MOSFETs respectively and the output transistor 3b and the transistors 9, 13 and 14 be formed of p-channel MOSFETs respectively. In this case, the voltage source 1 and the ground 2 are exchanged to each other.

What is claimed is:

1. A spike current reducing circuit comprising:
   an output transistor having a control terminal for outputting a spike current according to a control signal received at the control terminal; and
   an output transistor driving circuit for sending the control signal to the control terminal of the output transistor through a signal line of a first low impedance in a first driving stage to drive the output transistor at a high speed, sending the control signal to the control terminal of the output transistor through a signal line of a high impedance in a second driving stage to drive the output transistor at a low speed, and sending the control signal to the control terminal of the output transistor through a signal line of a second low impedance in a third driving stage to drive the output transistor at a high speed.

2. A spike current reducing circuit according to claim 1, wherein the output transistor driving circuit comprises
   a pull-up resistor; and
   a mirror transistor, which is connected with the output transistor in a mirror connection and is connected to the pull-up resistor through a signal line, for maintaining a voltage level of the signal line during the first driving stage and outputting a prescribed amount of sink current to change the voltage level of the signal line and to perform a transfer from the first driving stage to the second driving stage in response to the change of the voltage level of the signal line.

3. A spike current reducing circuit according to claim 1, wherein the change from the second driving stage to the third driving stage is performed in response to the change of an output voltage of the output transistor to a prescribed level.

4. A spike current reducing circuit according to claim 3, wherein the output transistor driving circuit comprises an inverter, having a threshold voltage adjusted according to the prescribed voltage level, for producing a trigger signal according to both the output voltage of the output transistor and the threshold voltage and changing the signal line of the high impedance in the second driving stage to the signal line of the second low impedance in the third driving stage according to the trigger signal.

5. A spike current reducing circuit according to claim 1, wherein a time-current characteristic of the spike current output from the output transistor is set almost in a trapezoid shape.

6. A spike current reducing circuit according to claim 1, wherein the output transistor driving circuit comprises
   a first low impedance driving circuit through which the control signal is sent to the control terminal of the output transistor at the first low impedance in the first driving stage;
   a high impedance driving circuit through which the control signal is sent to the control terminal of the output transistor at the high impedance in the second driving stage;
   a second low impedance driving circuit through which the control signal is sent to the control terminal of the output transistor at the second low impedance in the third driving stage; and
   a changing circuit for changing the control signal flowing through the first low impedance driving circuit to the control signal flowing through the high impedance driving circuit by changing a voltage level applied to the first low impedance driving circuit in response to the outputting of a prescribed amount of sink current, and changing the control signal flowing through the high impedance driving circuit to the control signal flowing through the second low impedance driving circuit by changing an output voltage of the output transistor to a prescribed level.

7. A spike current reducing circuit according to claim 6, wherein the second low impedance driving circuit comprises a plurality of second high impedance driving circuits arranged in parallel to each other, and
   the changing circuit comprises a plurality of inverters, which have a plurality of threshold voltage values different from each other and are connected to the second high impedance driving circuits respectively, for respectively making the control signal flow through the corresponding second high impedance driving circuit in cases where the output voltage of the output transistor is lowered to a value lower than the corresponding threshold value.

* * * * *